ULTRASONIC CONTROL APPARATUS WITH BI-DIRECTIONAL TRANSDUCER

Filed Jan. 30, 1963

INVENTOR.
William Kieffer
BY
Mueller & Aichele
Att'ys.

United States Patent Office 3,218,558
Patented Nov. 16, 1965

3,218,558

ULTRASONIC CONTROL APPARATUS WITH BI-DIRECTIONAL TRANSDUCER

William J. Kieffer, Santa Maria, Calif., assignor to Motorola, Inc., Chicago, Ill., a corporation of Illinois Filed Jan. 30, 1963, Ser. No. 254,984
5 Claims. (Cl. 325—392)

Figures 1, 2:
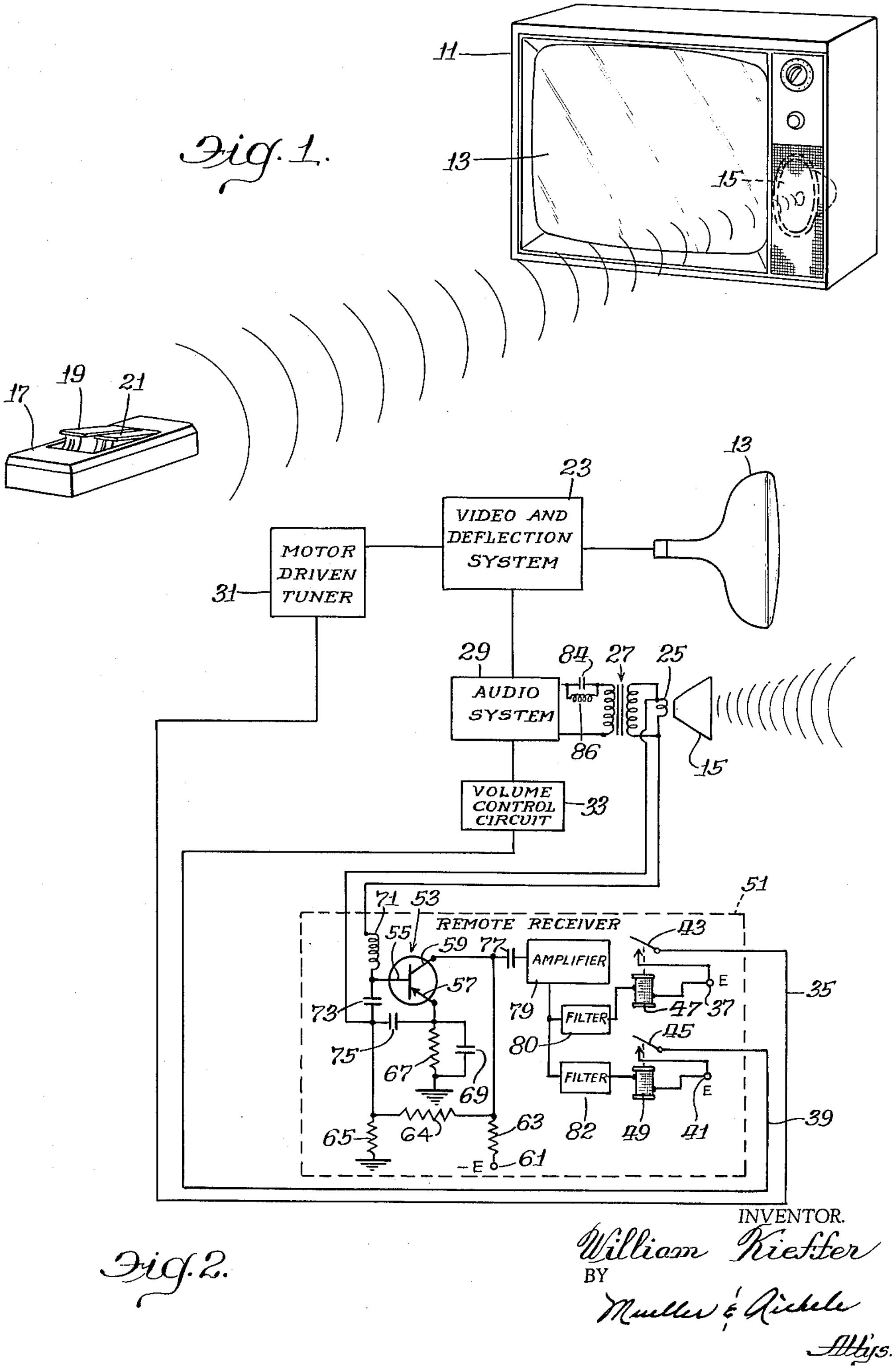

This invention relates to remote control apparatus, and more particularly to such apparatus for a unit having a loud speaker wherein the speaker is used as a pick-up for the remote control apparatus.

Electronic remote control systems are utilized in numerous applications where it is desired to control a particular function of a system with signals emanated from a remote source. Such remote control systems are especially advantageous in application to television receivers where the viewer generally is seated at a distance from the receiver, and hence would otherwise have to move to the receiver itself to control it. Supersonic signals are often used in such systems to insure that the remote control apparatus will not be triggered by audible sounds from the speaker of the system, or from other sources. This generally involves the use of an extra transducer, such as a microphone, to pick up these remote signals and translate them in the remote control apparatus. Such an extra transducer takes up room and adds expense to the overall system.

Accordingly, it is an object of this invention to provide an improved low cost remote control apparatus for a system utilizing an output audio transducer.

Another object of the invention is to eliminate the need for a microphone pick-up in remote control apparatus when used in a system having a speaker.

A feature of the invention is the provision of a remote control system for a device having a loud speaker, including a circuit coupling the loud speaker to an amplifier for supplying actuating current to a control circuit of the remote control system.

Another feature of the invention is the provision of a transistor input in the above mentioned amplifier, with the coupling circuit including impedance matching series resonant elements.

A further feature of the invention is the provision, in a remote control system with a speaker pick-up, of an attenuator circuit connected to the audio driver for the speaker which responds to and attenuates the critical frequency to which the remote control apparatus responds, thereby preventing signals to be reproduced by the speaker from triggering the system.

In the drawings:

FIG. 1 is a perspective view of a television receiver utilizing the invention; and FIG. 2 is a schematic diagram of a circuit constructed in accordance with the invention.

In practicing the invention, a system producing an audio frequency which is audibly reproduced by a transducer is provided with a remote control system which utilizes the transducer as a pick-up for control signals. The transducer, when acting with the remote control system, is coupled to an amplifier. The output of the amplifier is fed to filtering circuitry responsive only to signals of predetermined supersonic frequency. These signals may be produced by any suitable remote source. When such signals are received by the transducer, they are applied to the amplifier, and from there, through the filtering circuitry to control circuits which operate those functions of the system which are to be remotely controlled.

One application of the invention involves utilizing the speaker in a television receiver, which speaker is coupled through an amplifier and filtering circuitry to control circuits. These control circuits control operation of a motor driven tuner and a volume control circuit. In such case the circuit coupling the audio sections of the television receiver to the speaker includes an attenuator for removing signals of the frequency to which the filtering circuitry is responsive. This prevents false triggering of the control circuits by signals produced in the television receiver.

Referring now to FIG. 1, the latter described application of the invention is shown. A television receiver 11 is provided with a cathode ray tube 13 and a speaker 15 which respectively reproduce the video and audio portions of the signal transmitted from the broadcast station. In receiver 11, the speaker 15 is also utilized as a pick-up device to actuate the remote control apparatus contained therein, as will be explained.

Supersonic signals for controlling the remote control apparatus may be produced at a remote source. A remote unit 17, of which several types are well known in the art, may be hand held by the viewer of the television receiver 11. Unit 17 is provided with a pair of control triggers 19 and 21, each of which may be depressed by the viewer to cause a supersonic signal at a particular predetermined frequency to emanate from the unit 17. The two triggers provide different frequencies to actuate different controls. This signal will cause a response in speaker 15.

Referring now to FIG. 2, the general schematic diagram of a circuit constructed in accordance with the invention is shown. This type of circuit may be incorporated in a television receiver such as that shown in FIG. 1. A video and deflection system 23 is connected to cathode ray tube 13 and controls the video output thereof. A coupling transformer 27 coupled audio system 29 to drive a voice coil 25 of speaker 15, as is well known in the art. Speaker 15 may be of a commercially available type, the type commonly used in television receivers often having the necessary sensitivity at the control frequency. A motor driven tuner 31 applies signals to video and deflection system 23 and signals are coupled therefrom to the audio system 29. A volume control circuit 33, such as a stepping relay system, is connected to audio system 29 to control the audio output.

Current for operating tuner 31 is supplied through energizing circuit 35 from a voltage source 37. Similarly current for operating volume control circuit 33 is provided through energizing circuit 39 from source 41. A switch 43 is included in energizing circuit 35 and a switch 45 is included in energizing circuit 39. It will be apparent that closure of switch 43 will energize the motor driven tuner to operate the same and vary the tuning of the television receiver 11. Similarly closure of switch 45 will cause energization of volume control circuit 33 to control the output of audio system 29.

A relay 47 controls switch 43, and a relay 49 controls switch 45. As will be explained, receipt of remote control signals of predetermined frequency will selectively actuate one of the two relays 47 and 49. Thus, for example, if it is desired to change the channels of television receiver 11 by operating tuner 31, a particular trigger 19 or 21 on unit 17 will be pressed to cause signals of a predetermined supersonic frequency to emanate from the unit. These signals, as will be explained, activate the remote control apparatus to close relay 47. Similarly the other of triggers 19 and 21 on unit 17 may be depressed so as to send out a second signal of a different predetermined frequency to activate relay 49 and hence energize volume control circuit 33. This control function may be performed at the same time the speaker is reproducing audio signals, the speaker being usable in a bi-directional manner.

The operation of the remote control apparatus will be described. Speaker 15 will respond to signals transmitted by remote unit 17. These signals may be of any predetermined frequency. Voice coil 25 of speaker 15 is thereby caused to move and a current is generated therein.

Because the signals transmitted by remote unit 17 are supersonic, no deterioration of audible reproduction results and the bidirectional use of speaker 15 may be simultaneous. This current is applied to remote control receiver 51. Receiver 51 includes a transistor input stage 53 having a base electrode 55, emitter electrode 57 and collector electrode 59. Bias for transistor 53 is provided from a source of negative potential 61, and resistors 63, 64, 65, and 67 provide a biasing network for transistor 53. Capacitor 69 bypasses resistor 67.

The coupling circuitry from the voice coil 25 of speaker 15 of transistor 53, is composed of a choke 71 and a capacitor 73, connected across the voice coil with the base electrode 55 and emitter electrode 57 of transistor 53 connected across capacitor 73 through coupling capacitor 75.

Choke 71 and capacitor 73 form a series resonant circuit which is selected to pass a predetermined narrow band of frequencies. Upon receipt of such signals by speaker 15, they are amplified in transistor 55 and applied through capacitor 77 to a tuned amplifier 79. Amplifier 79 applies these signals to a pair of filters 80 and 82 which are each responsive only to one frequency within band of frequencies passed by the series resonant circuit. The filters selectively apply signals to either relay 47 or 49. This will close either switch 43 or 45 to provide the desired control, depending upon which of triggers 19 and 21 in remote unit 17 were depressed.

Speaker 15 will have a relatively low impedance compared with the impedance of the remote receiver 51, or more particularly transistor 53, so a way must be found to match the two impedances. The combination of choke 71 and capacitor 73 coupled across voice coil 25, provides the low impedance for the voice coil. The high impedance of transistor 53 is matched to the series resonant circuit by connecting the base 55 and emitter 57 of transistor 53 across capacitor 73, which has a high impedance. It would be possible to connect base 55 and emitter 57 across choke 71, however, since the transistor 53 has some inherent capacitance already, it is better to utilize this by connecting across capacitor 73.

Amplifier 79 must of necessity have high gain to provide the required output from the signal picked up by the speaker. Certain frequencies produced locally in the circuitry of the television receiver, unless otherwise eliminated, might therefore be selected and amplified sufficiently in amplifier 79 to energize relays 47 or 49. These signals are prevented from falsely actuating the remote control system by means of capacitor 84 and choke 86 connected in parallel to form a resonant circuit connected to audio system 29. This circuit is tuned to present a high impedance to signals in the predetermined narrow band of frequencies passed to transistor 53.

Although there may be a wide variety of speaker models which are satisfactory from an audio reproduction standpoint, there may be variations among each type of speaker as to its sensitivity to the frequencies put out by remote unit 17. As a result, that speaker model should be selected from among the satisfactory models that gives the best response at the desired frequencies. For example, where the desired frequency band is around 40 kc. any commercially available speaker giving satisfactory audio reproduction could be selected which exhibited good response at 40 kc. The additional gain required in amplification of the received signal will, in nearly every case be less expensive to attain than the saving in cost resulting from the elimination of a pickup microphone.

It may therefore be seen that the invention provides an improved, low cost remote control apparatus for a system utilizing a speaker, wherein the need for a microphone pick-up to trigger the remote control apparatus is eliminated

I claim:

1. Sound reproducing and remote control apparatus, including in combination, an audio transducer, first circuit means for driving said transducer with audio signals in a given frequency range so that such signals are reproduced as sound, said audio transducer being responsive to remotely originating waves of supersonic frequency outside of said frequency range to produce electrical signals of the supersonic frequency, a control circuit responsive to applied electrical signals of the supersonic frequency to perform a control function in said apparatus, and second circuit means connecting said audio transducer to said control circuit for applying the electrical signals of supersonic frequency thereto, whereby said control means may be operated in response to reception of supersonic waves by said audio transducer simultaneously with reproduction of audio signals by said transducer.

2. Sound reproducing and remote control apparatus, including in combination, an audio transducer, first circuit means for driving said transducer with audio signals in a given frequency range so that such signals are reproduced as sound, said audio transducer being responsive to remotely originating waves of supersonic frequency outside of said frequency range to produce electrical signals of the supersonic frequency, a control circuit responsive to applied electrical signals of the supersonic frequency to perform a control function in said apparatus, second circuit means connecting said audio transducer to said control circuit for applying the electrical signals of supersonic frequency thereto, and filter means connected between said first circuit means and the juncture between said circuit means and said audio transducer, said filter means being tuned to signals of a supersonic frequency for preventing such signals from passing from said first circuit means through said second circuit means to said control circuit and causing false response thereof, whereby said control means may be operated in response to reception of supersonic waves by said audio transducer simultaneously with reproduction of audio signals by said transducer.

3. In radio signal receiving apparatus having a speaker with a voice coil therein and an audio system for driving the same, remote control apparatus responsive to a remotely propagated control signal of supersonic frequency, including in combination, a motor driven tuner, control means responsive to signals of a given supersonic frequency to operate said tuner, an amplifier connected to said control means to apply amplified signals of supersonic frequency thereto, said amplifier having a transistor input stage with a pair of input electrodes, and a series resonant circuit connecting the voice coil of the speaker across said input electrodes of said transistor input stage to pass signals of supersonic frequency received by the speaker to said amplifier, whereby the speaker is utilized in a bidirectional manner both to audibly reproduce signals from the audio output and to simultaneously receive signals of the given supersonic frequency for operation of said remote control apparatus.

4. In a television receiver having a speaker with a voice coil therein and an audio system for driving the same, remote control apparatus responsive to remotely propagated control signals of supersonic frequency, including in combination, a motor driven tuner and volume control means, a selective circuit responsive to signals of two given supersonic frequencies to selectively operate said tuner and said volume control means, an amplifier connected to said selective circuit to apply amplified signals of supersonic frequency thereto, said amplifier having a transistor input stage with a pair of input electrodes, and coupling means connecting the voice coil of the speaker across said input electrodes, said coupling means consisting of a choke and a capacitor in series and resonant to pass a band of signals including signals of the two given supersonic frequencies, and means connecting said input electrodes of said transistor input stage across said capacitor, whereby the speaker is utilized in a bi-directional manner both to audibly reproduce signals from the audio output and to simultaneously receive signals of the two given supersonic frequencies for operation of said remote control apparatus, and whereby said transistor input stage and the speaker are impedance matched through said coupling means for optimum energy transfer.

5. A television receiver adapted for remote control, including in combination, means providing a video output, means including a speaker with a voice coil therein and an audio amplifier circuit connected thereto providing an audio output for driving the speaker, a volume control circuit for said audio amplifier and a first energizing circuit connected thereto, a motor driven tuner for tuning the television receiver and a second energizing circuit connected thereto, control means including relay means and selectively responsive to applied signals of two given supersonic frequencies to cause said relay means to close said first and second energizing circuits, an amplifier connected to said control means for applying amplified signals of supersonic frequency thereto, said amplifier having a transistor input stage with a pair of input electrodes, and coupling means connecting the voice coil of the speaker across said input electrodes, said coupling means including a choke and a capacitor connected in series and resonant to pass a band of signals including signals of the two given supersonic frequencies, and means connecting said input electrodes across said capacitor, and signal attenuating means connected to said audio amplifier to attenuate signals of the two given supersonic frequencies produced thereby, preventing false triggering of said control means, whereby the speaker is utilized in a bi-directional manner both to audibly reproduce signals from the audio amplifier and to simultaneously receive signals of the two given supersonic frequencies for selective operation of said motor driven tuner and said volume control circuits, and whereby said transistor input stage and the speaker are impedance matched through said coupling means for optimum energy transfer.

References Cited by the Examiner

UNITED STATES PATENTS

| | | | |
|---|---|---|---|
| 2,832,952 | 4/1958 | Bagno | 340—15 |
| 3,015,099 | 12/1961 | Willard | 343—176 |
| 3,027,497 | 3/1962 | Carlson et al. | 325—392 |

DAVID G. REDINBAUGH, *Primary Examiner.*